(12) United States Patent
Murayama (10) Patent No.: US 10,818,808 B2
(45) Date of Patent: Oct. 27, 2020

(54) METHOD OF PRODUCING NANOGRAIN MATERIAL, NANOGRAIN MATERIAL, AND PHOTOELECTRIC CONVERSION DEVICE

(75) Inventor: Koji Murayama, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 266 days.

(21) Appl. No.: 13/430,040

(22) Filed: Mar. 26, 2012

(65) Prior Publication Data

US 2012/0174969 A1   Jul. 12, 2012

Related U.S. Application Data

(63) Continuation of application No. PCT/JP2010/065815, filed on Sep. 14, 2010.

(30) Foreign Application Priority Data

Sep. 28, 2009   (JP) ................. 2009-222932

(51) Int. Cl.
*H01L 31/0352* (2006.01)
*H01L 51/42* (2006.01)
*H01L 51/00* (2006.01)

(52) U.S. Cl.
CPC .... *H01L 31/035218* (2013.01); *H01L 51/426* (2013.01); *H01L 51/0037* (2013.01);
(Continued)

(58) Field of Classification Search
CPC ................. B82Y 40/00; Y02E 10/549; Y10T 428/24942; Y02P 70/521;
(Continued)

(56) References Cited

U.S. PATENT DOCUMENTS 7,700,200 B2   4/2010   Bulovi et al.
2004/0023010 A1*   2/2004   Bulovic et al. ............... 428/209
(Continued)

FOREIGN PATENT DOCUMENTS

CN      1656856 A      8/2005
CN    101375425 A      2/2009
(Continued)

OTHER PUBLICATIONS

PCT/JP2010/065815 Written Opinion dated Dec. 15, 2010.
PCT/JP2010/065815 International Search Report dated Dec. 15, 2010.

*Primary Examiner* — Mayla Gonzalez Ramos
(74) *Attorney, Agent, or Firm* — Arent Fox LLP (57) ABSTRACT

A method of producing a nanograin material wherein a hole-transporting surfactant is injected into an InP/ZnS dispersion solution, and the surface of an InP/ZnS quantum dot is covered with the hole-transporting surfactant to prepare an InP/ZnS dispersion solution with a hole-transporting surfactant. The InP/ZnS dispersion solution with a hole-transporting surfactant is then applied to a substrate using a spin coating process of the like to form a quantum dot layer with a hole-transporting surfactant having one or more layers. Then, a dispersion solution (replacement solution) containing an electron-transporting surfactant is prepared. The substrate having the quantum dot layer with a hole-transporting surfactant is immersed in the replacement solution for a predetermined time, and part of the hole-transporting surfactant is replaced with the electron-transporting surfactant to form a quantum dot layer having one or more layer.

20 Claims, 7 Drawing Sheets

(52) U.S. Cl.
CPC ....... *H01L 2251/308* (2013.01); *Y02E 10/549* (2013.01); *Y02P 70/521* (2015.11); *Y10T 428/24942* (2015.01)

(58) Field of Classification Search
CPC ....... H01L 31/035218; H01L 2251/308; H01L 51/0037; H01L 51/426
USPC ........................................................ 136/252
See application file for complete search history.

(56) References Cited

U.S. PATENT DOCUMENTS

| | | |
|---|---|---|
| 2007/0162263 A1 | 7/2007 | Forrest |
| 2008/0206565 A1* | 8/2008 | Takahashi et al. ........... 428/403 |
| 2009/0087546 A1 | 4/2009 | Iizumi et al. |
| 2010/0108984 A1* | 5/2010 | Cho et al. ....................... 257/13 |

FOREIGN PATENT DOCUMENTS

| | | |
|---|---|---|
| CN | 101420016 A | 4/2009 |
| JP | 2008-214363 A | 9/2008 |
| JP | 2010-199067 A | 9/2010 |
| WO | WO-2003-21694 A2 | 3/2003 |
| WO | WO-2007-73467 A1 | 6/2007 |
| WO | WO-2008-104301 | 9/2008 |

\* cited by examiner

Fig. 11
PRIOR ART ously synthesized in a liquid phase, and usually covered at the surface with organic molecules of a surfactant so that quantum dots do not agglomerate together. That is, the colloidal quantum dot has the disadvantage that the potential barrier is high due to low conductivity of a surfactant caused by organic molecules, and therefore photoelectric conversion efficiency via carriers (holes and electrons) is low.

METHOD OF PRODUCING NANOGRAIN MATERIAL, NANOGRAIN MATERIAL, AND PHOTOELECTRIC CONVERSION DEVICE

CROSS REFERENCE TO RELATED APPLICATIONS

The present application is a continuation of International application No. PCT/JP2010/065815, filed Sep. 14, 2010, which claims priority to Japanese Patent Application No. 2009-222932, filed Sep. 28, 2009, the entire contents of each of which are incorporated herein by reference.

FIELD OF THE INVENTION

The present invention relates to a method of producing a nanograin material, a nanograin material and a photoelectric conversion device, and more particularly to a nanograin material with the surface of an ultrafine grain covered with a surfactant, a nanograin material, and a photoelectric conversion device such as a solar cell using the nanograin material.

BACKGROUND OF THE INVENTION

A quantum dot, which is an ultrafine grain having a grain size of 10 nm or less, is excellent in confinement of carriers (electron and hole), and therefore can easily generate an exciton by electron-hole recombination. Thus, emission of light from a free exciton can be expected and light emission with high emission efficiency and a sharp emission spectrum can be achieved. Furthermore, the quantum dot can be controlled over a wide range of wavelengths using a quantum size effect, and thus attention is given to their application to light emitting devices such as semiconductor lasers and light emitting diodes (LEDs).

By the way, colloidal quantum dots are chemically synthesized in a liquid phase, and usually covered at the surface with organic molecules of a surfactant so that quantum dots do not agglomerate together. That is, the colloidal quantum dot has the disadvantage that the potential barrier is high due to low conductivity of a surfactant caused by organic molecules, and therefore photoelectric conversion efficiency via carriers (holes and electrons) is low.

Furthermore, if a conductive polymer or a metallic material is used as a surfactant, a carrier injected into an electrode by application of a voltage passes through the surfactant from an anode to a cathode or from a cathode to an anode, thus making it difficult to efficiently confine the carrier in a quantum dot.

Figure 10:
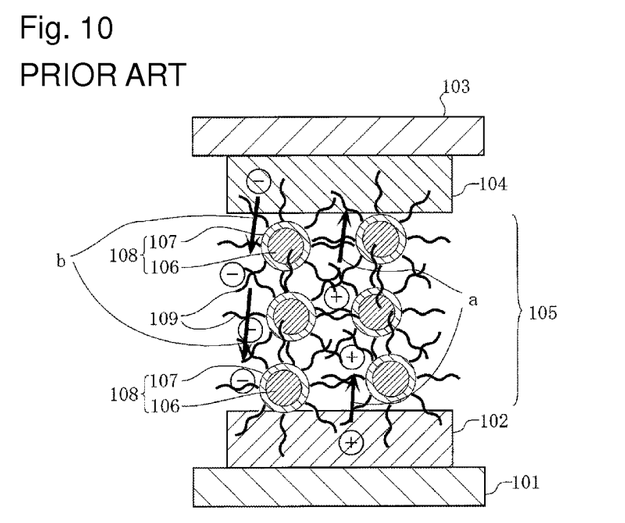
FIG. 10 is a sectional view schematically showing carrier transportation when a conductive surfactant is used.

FIG. 10 is a schematic diagram of a photoelectric conversion device on the premise of the use of a conductive surfactant.

The photoelectric conversion device has a quantum dot layer 105 interposed between a hole transport layer 102 formed on the upper surface of an anode 101 and an electron transport layer 104 formed on the lower surface of a cathode 103. The quantum dot layer 105 is covered at the surface with a conductive surfactant 109 so that quantum dots 108 made of a core portion 106 and a shell portion 107 do not agglomerate together. That is, the quantum dot layer 105 has a laminated structure in which a large number of quantum dots 108 are provided in parallel, and the conductive surfactant 109 is interposed between the quantum dots 108.

When a voltage is applied between the anode 101 and the cathode 103, a hole is injected into the anode 101 and an electron is injected into the cathode 103. As shown by arrow a and arrow b, the hole and electron as carriers pass through the conductive surfactant 109, and the hole is transported toward the cathode 103 and the electron is transported toward the anode 101 without being confined in the quantum dot 108. That is, if the conductive surfactant 109 is used, the carrier is merely charged, and the carrier cannot be confined in the quantum dot 108.

Thus, techniques of using a surfactant having both hole-transporting and electron-transporting ligands have been researched and developed.

For example, Patent Document 1 proposes a nanograin light emitting material having a surfactant made from at least two ligands localized on the surface of the quantum dot, wherein among the ligands, at least one is a hole-transporting ligand and at least one is an electron-transporting ligand.

In Patent Document 1, both a ligand having an electron transport function and a ligand having a hole transport function are disposed at the nanograin surface, thereby making it possible to control charge transportation between the ligands to thereby improve efficiency of injecting a charge into a nanograin.

Furthermore, in Patent Document 1, a nanograin light emitting material is produced by the following method.

First, methanol is added to a toluene dispersion of a CdSe nanograin covered at the surface with TOPO and the mixture is stirred, followed by centrifugation to generate a CdSe nanograin. The supernatant liquid is then removed, and the precipitated CdSe nanograin is dried, followed by adding chloroform to thereby obtain a chloroform solution of the CdSe nanograin. Then, a surfactant containing a hole-transporting ligand (e.g. α-NPD derivative) and an electron-transporting ligand (e.g. BPhen) are each added, and the mixture is stirred in a nitrogen atmosphere under room temperature/light shielding conditions for a predetermined time to perform ligand replacement operation. Thereafter, methanol is added to generate a precipitate and a supernatant is removed to obtain a powder. This operation is repeated several times to purify the powder, and chloroform is added to a final precipitate to thereby obtain a clear chloroform solution of a nanograin light emitting material.

That is, when ligand replacement is performed in a solution in which the hole-transporting ligand and the electron-transporting ligand coexist, replaced unnecessary ligands are suspended in the solution. Accordingly, if the solution is directly used to prepare a thin film, the unnecessary ligands exist in the film, and therefore the performance may be compromised.

Thus, in Patent Document 1, a series of operations of adding a poor solvent (e.g. methanol) to generate a precipitate and removing a supernatant liquid to eliminate unnecessary ligands are repeated multiple times to thereby completely remove unnecessary ligands (suspended matters), followed by dispersing the precipitate in a dispersion solvent to obtain a nanograin dispersion solution.

Patent Document 1: Japanese Patent Laid-Open Publication No. 2008-214363 (claim 1, paragraphs [0078] and [0079])

SUMMARY OF THE INVENTION

In Patent Document 1, however, steps of addition of a poor solvent→generation of a precipitate→removal of a supernatant liquid are repeated multiple times, and therefore a surfactant disposed at the nanograin surface may be detached in such steps, so that the coverage of the surface decreases, inactivation of surface defects becomes insufficient, and a hole and an electron recombine at the surface of the nanograin.

Figure 11:
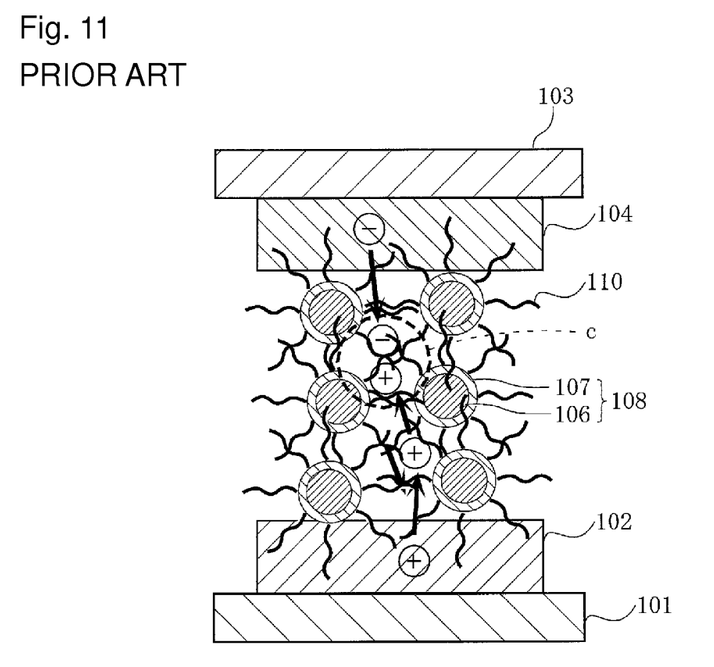
FIG. 11 is a schematic diagram for explaining the problems in Patent Document 1.

Moreover, in Patent Document 1, the hole and the electron are transported as they coexist in a surfactant 110 since the surfactant 110 has both hole-transporting and electron-transporting ligands as shown in FIG. 11, and as a result, the hole and the electron may recombine in the surfactant 110 as shown in c in FIG. 11.

Thus, in Patent Document 1, the hole and the electron may recombine at the outer surface of the quantum dot 108 and the interior of the surfactant 110 to decrease the quantum yield, resulting in reduction of carrier transport efficiency.

The present invention has been made in view of such considerations, and has, as an object, the provision of a method of producing a nanograin material which has good carrier transport efficiency and is suitable for use in a photoelectric conversion device, a nanograin material produced using the production method, and a photoelectric conversion device.

As a result of conducting intensive studies for achieving the object described above, the present inventor has reached the findings that by forming an ultrafine grain film covered with a surfactant having either one of a hole-transporting characteristic and an electron-transporting characteristic, followed by immersing the ultrafine grain film in a surfactant solution having the other transporting characteristic to perform ligand replacement operation, a nanograin material suitable for a photoelectric conversion device can be obtained without necessity of a series of complicated steps of removing unnecessary ligands and so on as in Patent Document 1.

Moreover, since two surfactants, a hole-transporting surfactant and an electron-transporting surfactant, are present at the surface of an ultrafine grain, surfactants which transport only electrons and only holes are concurrently present in the nanograin material and as a result, recombination of carriers in the surfactant can be more effectively prevented, whereby carrier transport efficiency can be exceptionally improved.

The present invention has been made on the basis of these findings, and a method of producing a nanograin material according to the present invention includes an ultrafine grain film forming step of forming an ultrafine grain film covered with a surfactant having either one of a hole-transporting characteristic and an electron-transporting characteristic; and an immersion step of immersing the ultrafine grain film formed in the ultrafine grain film forming step in a dispersion solution containing a surfactant having the other transporting characteristic different from the aforementioned transporting characteristic to form an ultrafine grain film covered with both the surfactants having a hole-transporting characteristic and an electron-transporting characteristic.

Furthermore, the method of producing a nanograin material according to the present invention is preferably one wherein the immersion step replaces part of the surfactant having one transporting characteristic with the surfactant having the other transporting characteristic, so that the surfactant having a hole-transporting characteristic and the surfactant having an electron-transporting characteristic are concurrently present.

Further, the method of producing a nanograin material according to the present invention is preferably one wherein the ultrafine grain film contains an oxide, a compound semiconductor and an element semiconductor.

Furthermore, a nanograin according to the present invention is prepared by the method described above.

Furthermore, by moving carriers between the hole-transporting surfactant and electron-transporting surfactant and a quantum dot using tunneling resonance, carriers can be moved quickly and efficiently without occurrence of phonon bottleneck. For this purpose, the hole-transporting surfactant is required to have a HOMO level which tunneling-resonates with the valence band of the quantum dot and the electron-transporting surfactant is required to have a LUMO level which tunneling-resonates with the transfer band of the quantum dot.

That is, the nanograin material of the present invention is preferably one wherein the hole-transporting surfactant has a HOMO level which tunneling-resonates with the valence band of a quantum dot which is an ultrafine grain.

Furthermore, the nanograin material of the present invention is preferably one wherein the electron-transporting surfactant has a LUMO level which tunneling-resonates with a transfer band of the quantum dot which is an ultrafine grain.

Furthermore, the photoelectric conversion device according to the present invention is a photoelectric conversion device having a quantum dot layer interposed between a first electrode and a second electrode, wherein the quantum dot layer is formed of the aforementioned nanograin material.

Furthermore, the photoelectric conversion device of the present invention is preferably one wherein an electron transport layer is formed between either one of the first electrode and the second electrode and the quantum dot layer, and a hole transport layer is formed between the other electrode and the quantum dot layer.

The method of producing a nanograin material according to the present invention includes an ultrafine grain film forming step of forming an ultrafine grain film covered with a surfactant having either one of a hole-transporting characteristic and an electron-transporting characteristic; and an immersion step of immersing the ultrafine grain film formed in the ultrafine grain film forming step in a dispersion solution containing a surfactant having the other transporting characteristic different from the aforementioned transporting characteristic to form an ultrafine grain film covered with both the surfactants having a hole-transporting characteristic and an electron-transporting characteristic, and therefore eliminates the necessity of a series of complicated steps such as a step of removing unnecessary ligands, and consequently ligand replacement operation can be performed without detachment of the surfactant from the surface of the ultrafine grain. Thus, a nanograin material having good transport efficiency which is suitable for a photoelectric conversion device can be obtained.

Moreover, since two surfactants, a hole-transporting surfactant and an electron-transporting surfactant, are present at the surface of an ultrafine grain, surfactants which transport only electrons and only holes are concurrently present in the nanograin material and as a result, recombination of carriers in the surfactant can be more effectively prevented, whereby carrier transport efficiency can be exceptionally improved.

That is, without recombination of a hole and an electron at or near the surface of a quantum dot, which is an ultrafine grain, and in a surfactant, a carrier generated in the quantum dot by photoirradiation can be efficiently transported to the electrode side, and a carrier injected into an electrode by application of a voltage can be efficiently transported into the quantum dot. Consequently, efficiency of transporting the carrier into the quantum dot (injection efficiency) and efficiency of transporting the carrier from the quantum dot (withdrawal efficiency) can be improved.

Furthermore, the hole-transporting surfactant has a HOMO level which tunneling-resonates with the valence band of the quantum dot which is an ultrafine grain, whereby the hole moves quickly between the quantum dot and the surfactant by tunneling resonance.

Furthermore, the electron-transporting surfactant has a LUMO level which tunneling-resonates with the transfer band of the quantum dot which is an ultrafine grain, whereby the electron moves quickly between the quantum dot and the surfactant by tunneling resonance.

In this way, by moving the carrier using tunneling resonance, efficient carrier transportation can be achieved without occurrence of phonon bottleneck.

Furthermore, according to the photoelectric conversion device of the present invention, in a photoelectric conversion device having a quantum dot layer interposed between the first electrode and the second electrode, the quantum dot layer is formed of the nanograin material described above, and therefore carrier transport efficiency is good at the quantum dot layer, conversion of an electric signal to a light signal or conversion of a light signal to an electric signal can be performed with high efficiency and various practical photoelectric conversion devices can be achieved.

DETAILED DESCRIPTION OF THE INVENTION

Embodiments of the present invention will now be described in detail with reference to accompanying drawings.

Figure 1:
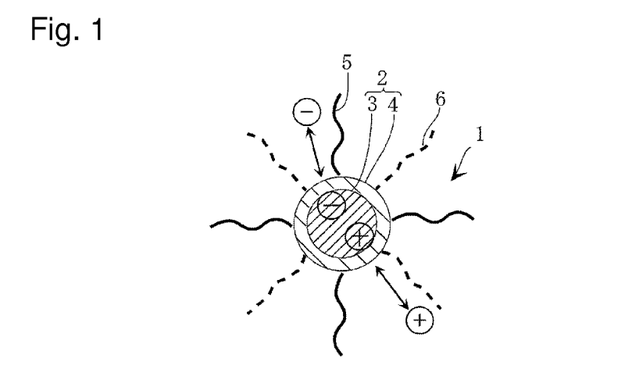
FIG. 1 is a sectional view schematically showing one embodiment of a nanograin material produced by a production method according to the present invention.

FIG. 1 is a sectional view schematically showing one embodiment of a nanograin material according to the present invention.

The nanograin material 1 is constituted such that a quantum dot 2, which is an ultrafine grain, has a core-shell structure having a core portion 3 and a shell portion 4 protecting the core portion 3, and the surface of the shell portion 4 is covered with a hole-transporting surfactant 5 having a hole-transporting characteristic and an electron-transporting surfactant 6 having an electron-transporting characteristic.

Here, a core material forming the core portion 3 is not particularly limited as long as it is a semiconductor material which exhibits a photoelectric conversion effect, and InP, CdSe, CdS, PbSe and the like may be used and as for example, ZnS may be used as a shell material forming the shell portion 4.

The aforementioned nanograin material 1 is produced by a method as described below.

A quantum dot dispersion solution is first prepared.

For the quantum dot 2, which is an ultrafine grain, various materials may be used as described above but in this embodiment, a case where InP is used for the core portion 3 and ZnS is used for the shell portion 4 is described as an example.

For example, indium acetate, myristic acid and octadecene are mixed in a vessel, and stirred in a nitrogen atmosphere and dissolved to thereby prepare an indium precursor solution. In addition, tristrimethylsilylphosphine, octylamine and octadecene are mixed in a nitrogen atmosphere to thereby prepare a phosphorus precursor solution.

The indium precursor solution is then heated to a predetermined temperature (e.g. 190° C.) and the phosphorus precursor solution is injected into the heated solution. As a result, the highly active precursors react with each other under the high temperature, and indium and phosphorus are bonded together to form a nucleus, followed by reacting with surrounding unreacted components to develop crystals, whereby an InP quantum dot is prepared.

Next, a zinc oxide solution obtained by dissolving zinc oxide in stearic acid and a sulfur solution obtained by dissolving sulfur in stearic acid are prepared.

Next, slight amounts of the zinc oxide solution and the sulfur solution are alternately added dropwise to the InP quantum dot solution adjusted to a predetermined temperature (e.g. 150° C.), and the mixture is heated and cooled, and washed to remove excessive organic components in the solution. Thereafter, the resulting product is dispersed in a nonpolar solvent, for example, toluene to thereby prepare an InP/ZnS dispersion solution, i.e. a quantum dot dispersion solution.

Next, the hole-transporting surfactant 5 is injected into the aforementioned quantum dot dispersion solution, and the surface of the quantum dot 2 made of InP/ZnS is covered with the hole-transporting surfactant 5 to thereby prepare a quantum dot dispersion solution with a hole-transporting surfactant (hereinafter referred to as "quantum dot dispersion solution with a hole-transporting characteristic").

Figure 2A:
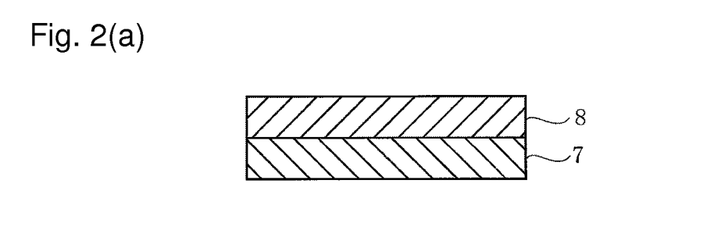
FIGS. 2(a) and 2(b) are production flow charts showing one embodiment (first embodiment) of the method of producing a nanograin material according to the present invention.
Figure 2B:
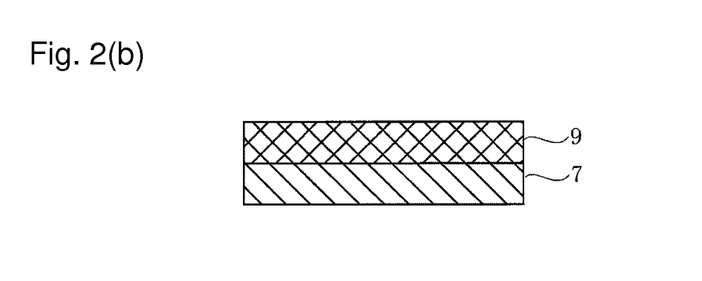

Thereafter, the nanograin material 1 is produced by a method as shown in FIGS. 2(a) and 2(b).

That is, using a spin coating process or the like, the quantum dot dispersion solution with a hole-transporting characteristic is applied to a substrate 7 to form a quantum dot layer with a hole-transporting characteristic 8 having one or more layer(s) as shown in FIG. 2(a).

A dispersion solution containing the electron-transporting surfactant 6 (hereinafter referred to as "replacement solution") is then prepared.

Here, for the dispersion solvent of the replacement solution, a solvent having a polarity opposite to that of the dispersion solvent of the quantum dot dispersion solution with a hole-transporting characteristic, for example, a polar solvent such as methanol is used if a nonpolar solvent such as toluene is used for the dispersion solvent of the quantum dot dispersion solution with a hole-transporting characteristic.

Next, the substrate 7 having the quantum dot layer with a hole-transporting characteristic 8 formed on the surface is immersed in the aforementioned replacement solution and part of the hole-transporting surfactant 5 is replaced with the electron-transporting surfactant 6 to form a quantum dot layer 9 having one or more layer(s) as shown in FIG. 2(b), and this quantum dot layer 9 is the nanograin material.

That is, when the substrate 7 having the quantum dot layer with a hole-transporting characteristic 8 formed thereon is immersed in the replacement solution, a concentration gradient is formed from the surface in the thickness direction between the hole-transporting surfactant 5 and the electron-transporting surfactant 6. The area close to the surface is replaced with the electron-transporting surfactant 6 at a higher concentration, and the area close to the substrate 7 has the hole-transporting surfactant 5 remaining at a high concentration.

A replacement ratio gradient is also generated by the thickness and film density.

That is, in the area of the quantum dot layer with a hole-transporting characteristic 8 where the film density is low, the hole-transporting surfactant 5 is almost fully replaced with the electron-transporting surfactant 6 irrespective of the film thickness due to a sufficiently long replacement reaction, but in the area which has a high film density and is dense, only the surface is replaced, or the hole-transporting surfactant 5 remains without being replaced. In the area of the quantum dot layer with a hole-transporting characteristic 8 where the film thickness is small, even a somewhat dense film is fully replaced due to the sufficiently long replacement reaction. Furthermore, since the replacement rate decreases as going away from the surface, replacement to the electron-transporting surfactant 6 is hard to occur, and thus a gradient is generated in the ratio of replacement of the hole-transporting surfactant 5 to the electron-transporting surfactant 6.

In this way, the substrate 7 is immersed in a replacement solution to perform ligand replacement for a predetermined time period during which the hole-transporting surfactant 5 and the electron-transporting surfactant 6 are concurrently present (e.g. 60 minutes). Thus, the quantum dot layer 9, namely a nanograin material, in which the quantum dots 2 covered with two surfactants, the hole-transporting surfactant 5 and the electron-transporting surfactant 6, are provided in parallel on the substrate 7 and which has a laminated structure having one or more layer(s), is prepared.

In this embodiment, the quantum dot layer with a hole-transporting characteristic 8 is formed on the substrate 7, and is thereafter immersed in a replacement solution containing the electron-transporting surfactant 6, and part of the hole-transporting surfactant 5 is replaced with the electron-transporting surfactant 6 to thereby have the hole-transporting surfactant 5 and the electron-transporting surfactant 6 concurrently present, and therefore the surfactant disposed at the surface of the shell portion 4 of the quantum dot 2 can be prevented from being detached from the shell portion 4. That is, a nanograin material can be obtained in which the surface coverage of the surfactant covering the shell portion 4 does not decrease, inactivation of surface defects can be maintained and the quantum yield is not reduced.

That is, as described above, if, while the hole-transporting surfactant 5 and the electron-transporting surfactant 6 are allowed to coexist each in the form of a quantum dot dispersion solution, one surfactant (ligand) is replaced with the other surfactant (ligand), the hole-transporting ligand made unnecessary by replacement with the electron-transporting surfactant 6 is suspended in the quantum dot dispersion solution. Accordingly, when a thin film is prepared using the quantum dot dispersion solution, the aforementioned unnecessary ligand may exist in the film to impair the function.

However, if a series of steps: addition of a poor solvent-→generation of a precipitate→removal of a supernatant liquid are repeated multiple times to remove unnecessary ligands as in Patent Document 1, the surfactant covering the surface of the shell portion 4 may be detached, so that the surface coverage decreases, inactivation of surface defects becomes insufficient, and the hole and the electron recombine near the outer surface of the shell portion 4, resulting in reduction of the quantum yield, thus making it impossible to obtain a good carrier-transporting characteristic.

Thus, in this embodiment, the quantum dot layer with a hole-transporting characteristic 8 described above is formed on the substrate 7, and is thereafter immersed in a replacement solution and required replacement operation is performed to thereby obtain the nanograin material 1 having a good quantum yield while having the hole-transporting surfactant 5 and the electron-transporting surfactant 6 concurrently present.

Moreover, by covering the surface of the quantum dot 2, which is an ultrafine grain, with the hole-transporting surfactant 5 and the electron-transporting surfactant 6 concurrently present, only holes and only electrons are transported via their respective surfactants (hole-transporting surfactant 5 and electron-transporting surfactant 6), and therefore electron-hole recombination in the surfactant is inhibited, thus making it possible to transport carriers (electron and hole) efficiently.

For example, carriers are generated in the ultrafine grain 2 by photoirradiation, and upon occurrence of exciton absorption, carriers are withdrawn from the ultrafine grain 2. Among withdrawn carriers, a hole is transported through the interior of the hole-transporting surfactant 5 to the anode side and an electron is transported through the interior of the electron-transporting surfactant 6 to the cathode side. That is, the hole-transporting surfactant 5 and the electron-transporting surfactant 6 each form a bulk-hetero network, the hole-transporting surfactant 5 transports only holes and the electron-transporting surfactant 6 transports only electrons.

Furthermore, when carriers are injected into an electrode by application of a voltage, a hole injected into an anode is transported through the interior of the bulk-hetero network of the hole-transporting surfactant 5 to the interior of the quantum dot 2. Furthermore, an electron injected into a cathode is transported through the interior of the bulk-hetero network of the electron-transporting surfactant 6 to the interior of the quantum dot 2.

Thus, in this embodiment, detachment of the surfactant from the quantum dot 2 can be avoided, and therefore inactivation of surface defects can be sufficiently maintained without reduction of the surface coverage of the surfactant. Moreover, the hole and the electron are transported by way of a different pathway through the hole-transporting surfactant 5 and the electron-transporting surfactant 6, respectively, and therefore the hole and the electron are efficiently transported to the anode and the cathode or from the quantum dot 2 to the outside without recombining at the surface of the quantum dot 2 and in the surfactant. This allows photoelectric conversion of a light signal to an electric signal and photoelectric conversion of an electric signal to a light signal to be performed with high efficiency.

Furthermore, as the hole-transporting surfactant 5, a material having a ligand introduced into a low-molecular material for a hole transport layer may be used.

As the low-molecular material for a hole transport layer, for example, N,N'-diphenyl-N,N'-bis(3-methylphenyl)-1,1'-biphenyl-4,4'-diamine (hereinafter referred to as "TPD") expressed by chemical formula (1), 4,4'-bis[N-(1-naphthyl)-N-phenyl-amino]biphenyl (hereinafter referred to as "α-NPD") expressed by chemical formula (2), 4,4',4"-tris(2-naphthylphenylamino)triphenylamine (hereinafter referred to as "2-TNATA") expressed by chemical formula (3), N,N'-7-di(1-naphthyl)-N,N'-diphenyl-4,4'-diaminobiphenyl) (hereinafter referred to as "Spiro-NPB") expressed by chemical formula (4), 4,4',4"-tris(3-methylphenylphenylamino)triphenylamine (hereinafter referred to as "m-MTDATA") expressed by chemical formula (5), and derivatives thereof may be used.

[Chemical Formula 1]

(1)

TPD

[Chemical Formula 2]

(2)

α-NPD

[Chemical Formula 3]

(3)

2-TNATA

[Chemical Formula 4]

(4)

Spiro-NPB

[Chemical Formula 5]

(5)

m-MTDATA

Furthermore, the ligand is not particularly limited as long as it is a polar group and for example, one or more thiol group (—SH), amino group (—NH$_2$), carboxyl group (—COOH), carbonyl group (—CO), nitro group (—NO$_2$), phosphino group (—PH$_2$), phosphoroso group (—PO) and the like may be used.

Accordingly, as the hole-transporting surfactant, for example, a TPD-thiol ligand having a thiol group introduced into TPD, an α-NPD-amino ligand having an amino group introduced into α-NPD or the like may be used. The surfactant may be dispersed in a nonpolar solvent if one ligand is introduced, and may also be dispersed in a polar solvent if two or more ligands are introduced.

Moreover, a macromolecular material such as poly(3,4-ethylenedioxythiophene):poly(styrene sulphonate) (hereinafter referred to as "PEDOT:PSS") expressed by chemical formula (6) may be suitably used as a material for a hole transport layer, but is not preferable for use in a material for a hole-transporting surfactant. This is because the macromolecular material has a large molecular size causing steric hindrance, so that the adjacent distance cannot be reduced, and resultantly the surface coverage of the quantum dot 2 decreases leading to a reduction in quantum yield or the density of the quantum dot layer cannot be increased.

[Chemical Formula 6]

PEDOT:PSS

Furthermore, as the electron-transporting surfactant 6, a material having a ligand introduced into a material for an electron transport layer may be used.

As the material for an electron transport layer, for example, 2-(4-biphenylyl)-5-(4-t-butylphenyl)-1,3,4-oxadiazole (hereinafter referred to as "PBD") expressed by chemical formula (7), 2,2',2"-(1,3,5-benzylnitrile)-tris(1-phenyl-1-H-benzoimidazole (hereinafter referred to as "TPBi") expressed by chemical formula (8), 2,9-dimethyl-4,7-diphenyl-1,10-phenanthroline (hereinafter referred to as "BCP") expressed by chemical formula (9), 3-(benzothiazole-2-yl)-7-(diethylamino)-2H-1-benzopyran-2-one (hereinafter referred to as "Coumarin 6") expressed by chemical formula (10), bis(2-methyl-8-quinolinolate)-4-(phenylphenolate aluminum (hereinafter referred to as "BAlq") expressed by chemical formula (11), 4,4'-bis(9-carbazolyl)-2,2'-dimethylbiphenyl (hereinafter referred to as "CDBP") expressed by chemical formula (12), and derivatives thereof may be used.

[Chemical Formula 7]

PBD

[Chemical Formula 8]

TPBi

[Chemical Formula 9]

BCP

[Chemical Formula 10]

Coumarin 6

[Chemical Formula 11]

BAlq

[Chemical Formula 12]

(12)

CDBP

Moreover, tris(8-hydroxyquinoline)aluminum (hereinafter referred to as "Alq3") expressed by chemical formula (13) may be suitably used as a material for an electron transport layer, but is not preferable for use in the electron-transporting surfactant 6. This is because Alq3 has poor solubility, reduces the density of the ligand to compromise usability, and easily emits light, so that the electron may recombine with the hole to generate an exciton in the surfactant.

[Chemical Formula 13]

(13)

Alq3

Furthermore, as in the case of the hole-transporting surfactant 5, the ligand is not particularly limited as long as it is a polar group and for example, a thiol group (—SH), an amino group (—NH$_2$), a carboxyl group (—COOH), a carbonyl group (—CO), a nitro group (—NO$_2$), a phosphino group (—PH$_2$), a phosphoroso group (—PO) and the like may be used.

Accordingly, as the electron-transporting surfactant 6, for example, a PBD-thiol ligand having a thiol group introduced into PBD, a BCP-amino ligand having an amino group introduced into BCP or the like may be used.

Furthermore, it is necessary to prevent the hole-transporting surfactant 5 and the electron-transporting surfactant 6 from mixing with each other, and therefore a dispersion solvent for the hole-transporting surfactant 5 and a dispersion solvent for the electron-transporting surfactant 6 should have opposite polarities. That is, for example, if a nonpolar solvent such as toluene is used for the dispersion solvent for the hole-transporting surfactant 5, a polar solvent such as methanol should be used for the dispersion solvent for the electron-transporting surfactant 6, and for the hole-transporting surfactant 5 and the electron-transporting surfactant 6, materials which are suitable at least for these dispersion solvents are selected.

Figure 3:
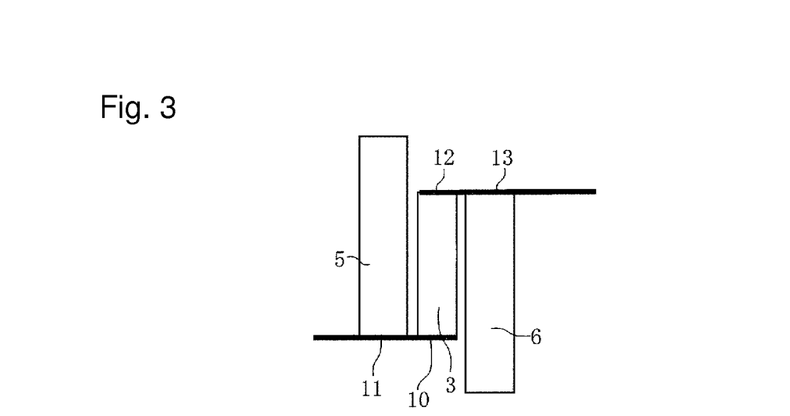
FIG. 3 is a view showing a relationship between the energy level of each surfactant and the energy level of a quantized carrier of an ultrafine grain.

Further, for the nanograin material produced using the production method of the present invention, materials are preferably selected so that the energy level of the surfactants 5 and 6 and the energy level of the quantized carrier of the quantum dot 2 have a relationship shown in FIG. 3.

That is, the hole-transporting surfactant 5 preferably has a highest occupied molecular orbital level (hereinafter referred to as "HOMO level") 11 which tunneling-resonates with an energy level of a valence band (hereinafter referred to as "valence band level") 10 of the core portion 3, which is an energy band allowing a hole to move therethrough, and the electron-transporting surfactant 6 preferably has a lowest unoccupied molecular orbital level (hereinafter referred to as "LUMO level") 13 which tunneling-resonates with an energy level of a transfer band (hereinafter referred to as "transfer band level") 12 of the core portion 3, which is an energy band allowing an electron to move therethrough.

By utilizing tunneling resonance in this way, the carrier can easily pass through the energy barrier, and efficient carrier movement can be achieved.

In a quantum-mechanical system, the state of energy possessed by a molecule corresponds to a molecular orbital where electrons exist, and can be classified into a ground state which is energetically lowest and stable and an excited state which is energetically higher than the ground state. The molecule is in a ground state before being irradiated with light, and molecular orbitals are occupied by electrons in order with the energetically lowest molecular orbital first. Among the molecular orbitals in a ground state, the highest molecular orbital is called a HOMO, and the energy level corresponding to the HOMO is a HOMO level. On the other hand, when irradiated with light, the molecule is brought into an excited state and molecular orbitals are brought into an empty state where they are not occupied by electrons. Among these molecular orbitals which are not occupied by electrons, the lowest molecular orbital is called a LUMO, and the energy level corresponding to the LUMO is a LUMO level. The electron moves through a transfer band and the hole moves through a valence band.

The hole-transporting surfactant 5 preferably has the HOMO level 11 which tunneling-resonates with the valence band level 10 of the core portion 3, which is an energy band allowing a hole to move therethrough as described above. Specifically, the hole-transporting surfactant 5 having the HOMO level 11 in a range of ±0.2 eV relative to the valence band level 10 of the core portion 3 is preferably used and for example, if InP (valence band level: 5.7 eV) is used for the core portion 3, a TPD-thiol ligand with the HOMO level 11 of 5.6 eV may be used as the hole-transporting surfactant 5.

In this connection, the HOMO level 11 of the hole-transporting surfactant 5 can be determined from band gap energy estimated from a work function.

Furthermore, the electron-transporting surfactant 6 also preferably has the LUMO level 13 which tunneling-resonates with the transfer band level 12 of the core portion 3, which is an energy band allowing an electron to move therethrough as described above. Specifically, the electron-transporting surfactant 6 having the LUMO level 13 in a range of ±0.2 eV relative to the transfer band level 12 of the core portion 3 is preferably used and for example, if InP (valence band level: about 3 eV) is used for the core portion 3, a BCP-amino ligand with the LUMO level 13 of 3.2 eV may be used as the electron-transporting surfactant 6.

In this connection, the LUMO level 13 of the electron-transporting surfactant 6 can be determined from band gap energy estimated from a work function and an absorption end of an absorption spectrum.

Thus, by satisfying an energy state such that the HOMO level 11 of the hole-transporting surfactant 5 and the valence band level 10 of the core portion 3 as well as the LUMO level 13 of the electron-transporting surfactant 6 and the transfer band level 12 of the core portion 3 mutually tunneling-resonate, the carrier transport characteristics can be improved without occurrence of phonon bottleneck.

Figure 4:
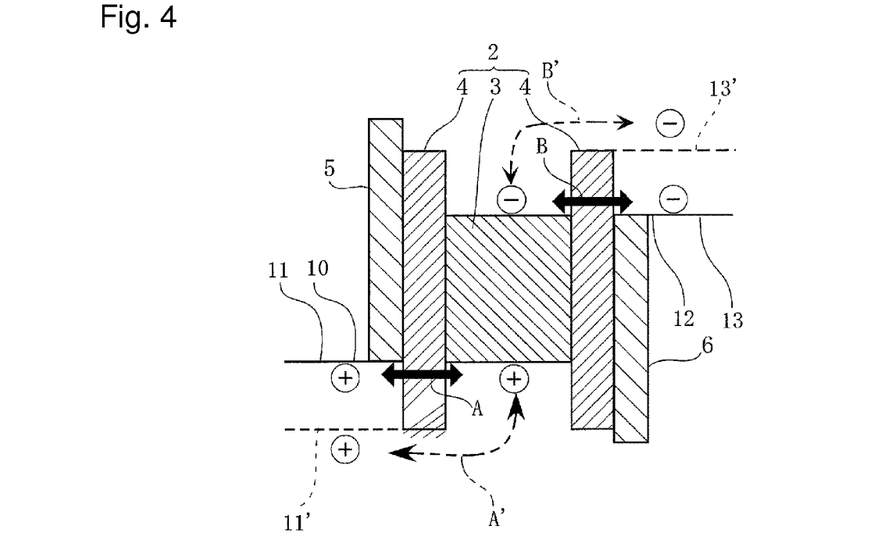
FIG. 4 is a schematic diagram showing the principle of carrier movement by tunneling resonance.

FIG. 4 is a schematic diagram showing the principle of carrier movement by tunneling resonance.

The quantum dot 2 is made of the core portion 3 and the shell portion 4 as described above. The shell portion 4 is usually an ultrathin film of 1 nm or less, and therefore the carrier easily passes through the portion owing to the tunnel effect, but it is desirable that the carrier should also be quickly moved between the core portion 3 and the surfactants 5 and 6 to improve carrier transport efficiency.

However, if there is a large difference in energy level such that the HOMO level 11 of the hole-transporting surfactant 5 and the valence band level 10 of the core portion 3 do not tunneling-resonate with each other, the hole moves such that it overrides the energy barrier as shown in arrow A'. Similarly, if there is a large difference in energy level such that the LUMO level 13 of the electron-transporting surfactant 6 and the transfer band level 12 of the core portion 3 do not tunneling-resonate with each other, the electron moves such that it overrides the energy barrier as shown in arrow B'.

Furthermore, in the nanograin system, movement of a phonon is slow, the speed is limited by the slow movement of the phonon to cause phonon bottleneck and therefore quick movement of the carrier is difficult.

Thus, in this embodiment, the hole-transporting surfactant 5 has the HOMO level 11 which tunneling-resonates with the valence band level 10 of the core portion 3, and the electron-transporting surfactant 6 has the LUMO level 13 which tunneling-resonates with the transfer band level 12 of the core portion 3, whereby the carrier can be quickly moved as shown in arrows A and B to improve carrier transport efficiency.

Figure 5:
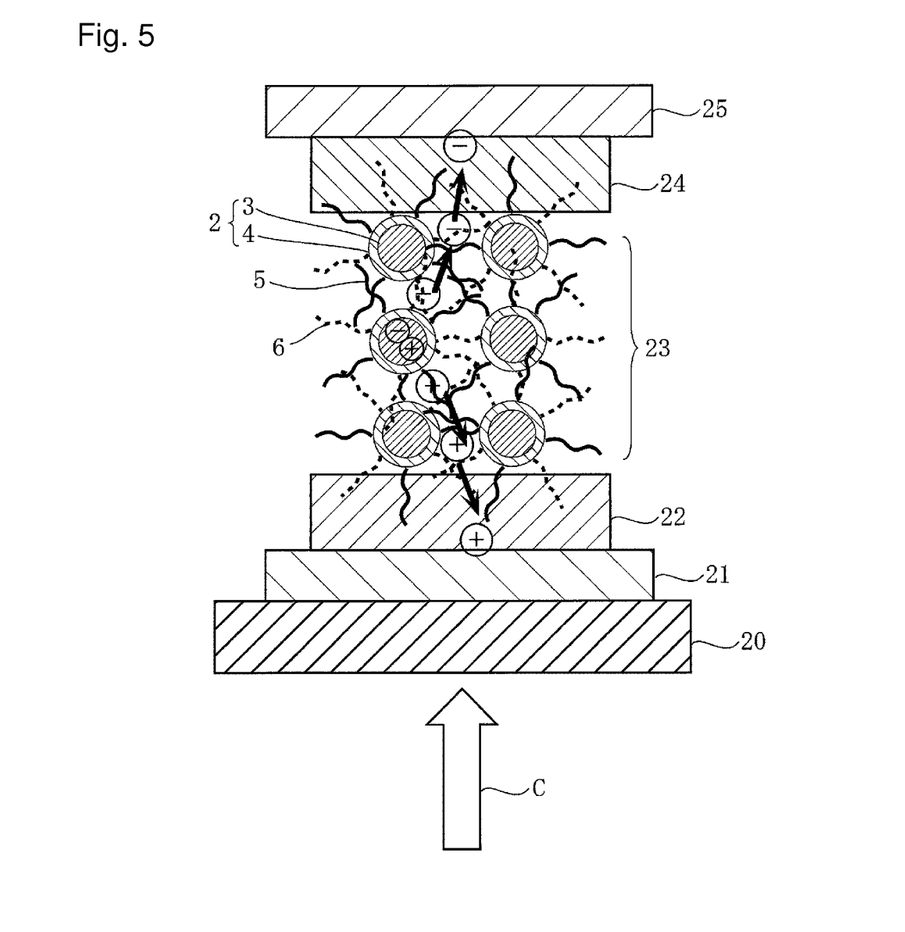
FIG. 5 is a sectional view schematically showing one embodiment of a photoelectric conversion device according to the present invention.

FIG. 5 is a sectional view schematically showing one embodiment of a solar cell as a photoelectric conversion device using the nanograin material 1 described above.

This solar cell is constituted such that an anode 21 is formed on a glass substrate 20, a hole transport layer (p layer) 22 made of a hole-transporting material is formed on the surface of the anode 21, a quantum dot layer (i layer) 23 of laminated structure formed of the nanograin material 1 of the present invention is formed on the surface of the hole transport layer 22, further an electron transport layer (n layer) 24 made of an electron-transporting material is formed on the surface of the quantum dot layer 23, and a cathode 25 is formed on the surface of the electron transport layer 24.

In this solar cell, when irradiated with light in a direction shown in arrow C, carriers are generated in the core portion 3 of the quantum dot 2 and withdrawn to outside the core portion 3 by exciton absorption. Among carriers, a hole is transported to the hole transport layer 22 through the hole-transporting surfactant 5 forming a bulk hetero network, and further transported to the anode 21. On the other hand, an electron is also transported to the electron transport layer 24 through the electron-transporting surfactant 6 forming a bulk hetero network, and further transported from the electron transport layer 24 to the cathode 25, whereby a photoelectromotive force is produced.

In this way, in the solar cell described above, the hole and the electron are transported from the quantum dot 2 by way of a different pathway through the hole-transporting surfactant 5 and the electron-transporting surfactant 6 to the hole transport layer 22 and the electron transport layer 24, respectively, and therefore the hole and the electron do not approach to each other to undergo recombination, and can be efficiently transported.

Moreover, since the hole-transporting surfactant 5 has the HOMO level 11 which tunneling-resonates with the valence band level 10 of the core portion 3 and the electron-transporting surfactant 6 has the LUMO level 13 which tunneling-resonates with the transfer band level 12 of the core portion 3, carriers can be moved quickly without occurrence of phonon bottleneck.

FIGS. 6(a) to 6(c) and 7(d) to 7(f) each are a production flow chart showing a method of producing the solar cell described above.

Figure 6A:
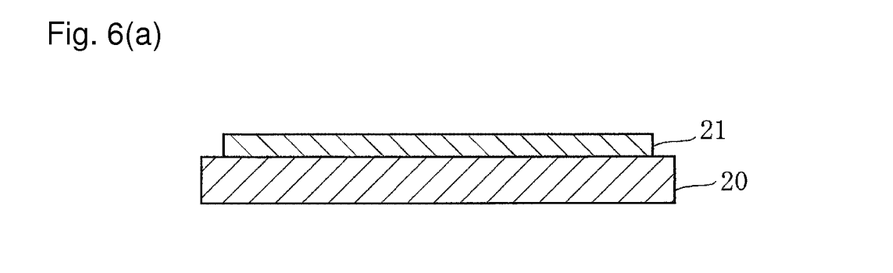
FIGS. 6(a) to 6(c) are production flow charts (1/2) showing a method of producing the photoelectric conversion device according to the present invention.

As shown in FIG. 6(a), an ITO film is formed on a transparent substrate 20 by a sputtering process, and subjected to UV ozonization to form the anode 21 having a thickness of 100 nm to 150 nm.

Next, a hole-transporting dispersion solution is prepared. As a hole-transporting material, PEDOT:PSS, TPD, α-NPD, 2-TNATA, Spiro-NPB, m-MTDATA and the like may be used, but a hole-transporting material soluble in a dispersion solvent having a polarity different from that of a dispersion solvent for the hole-transporting surfactant is selected and for example, if a polar solvent such as water is used as a dispersion solvent, PEDOT:PSS, which is soluble in water, is used.

Figure 6B:
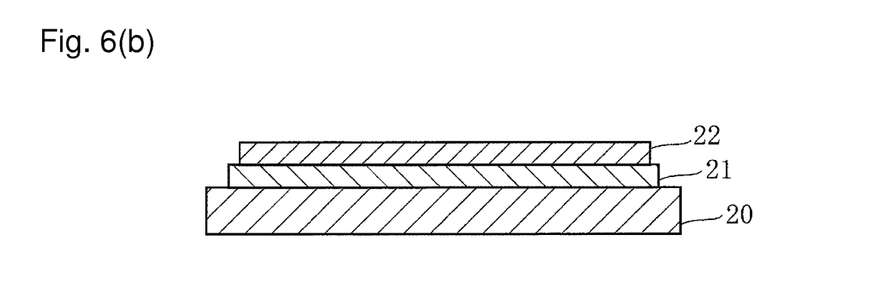

Using a spin coating process or the like, the hole-transporting dispersion solution is applied to the anode 21 to form the hole transport layer 22 having a thickness of 20 nm to 30 nm as shown in FIG. 6(b).

Next, the quantum dot dispersion solution with a hole-transporting characteristic described above is prepared.

Figure 6C:
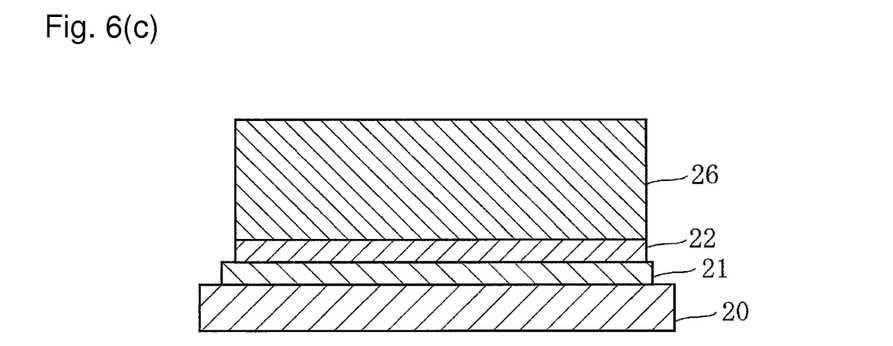

Using a spin coating process or the like, the quantum dot dispersion solution with a hole-transporting characteristic is applied to the hole transport layer 22 to form a quantum dot layer with a hole-transporting characteristic 26 with a thickness of 300 nm to 1000 nm having a laminated structure as shown in FIG. 6(c).

Figure 7D:
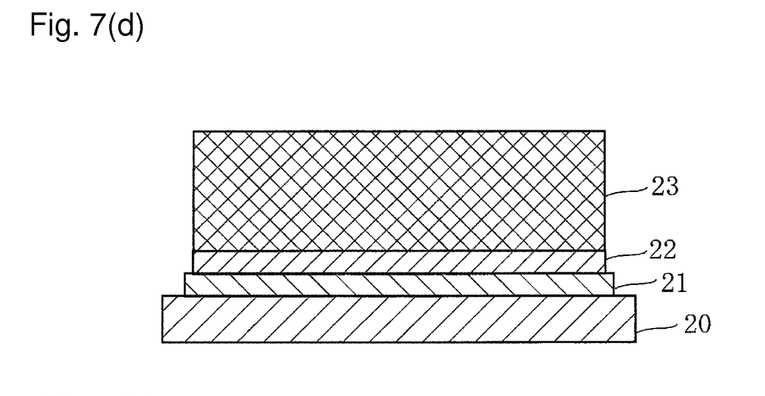
FIGS. 7(d) to 7(f) are production flow charts (2/2) showing a method of producing the photoelectric conversion device according to the present invention.

Next, the replacement solution described above is prepared. Then, the substrate 20 having the quantum dot layer with a hole-transporting characteristic 26 formed thereon is immersed in the replacement solution, and part of the TPD-thiol ligand is replaced with the BCP-amino ligand to form the quantum dot layer 23 with a thickness of 300 nm to 1000 nm in which the hole-transporting surfactant and the electron-transporting surfactant are concurrently present as shown in FIG. 7(d).

Figure 7E:
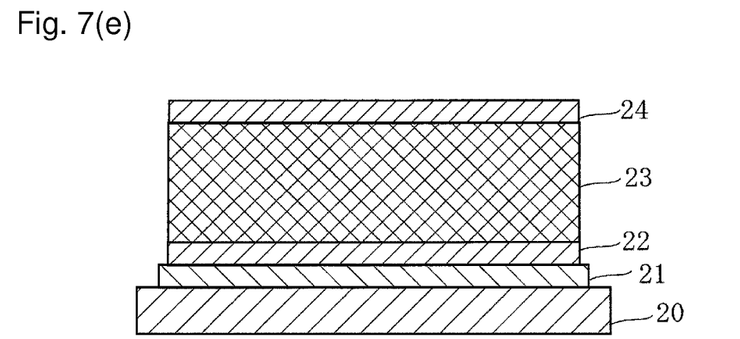

Next, an electron-transporting material such as Alq3 is used to form the electron transport layer 24 with a thickness of 50 nm to 70 nm on the surface of the quantum dot layer 23 by a vacuum deposition process as shown in FIG. 7(e).

Figure 7F:
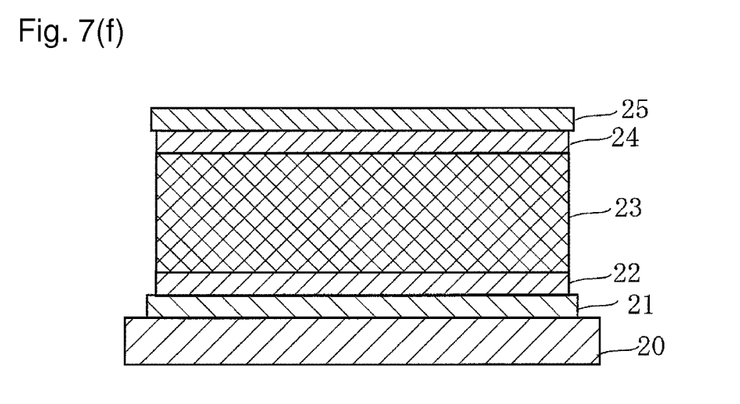

As shown in FIG. 7(f), Ca, Al, etc. are used to form the cathode 25 with a thickness of 100 nm to 300 nm by a vacuum deposition process, whereby a solar cell is prepared.

Thus, in this embodiment, the hole-transporting surfactant 5 and the electron-transporting surfactant 6 are allowed to be concurrently present without reducing the coverage of the surfactant disposed at the surface of the shell portion 4 so that inactivation of surface defects of the shell portion 4 cannot be maintained, and therefore the nanograin material 1 having good carrier transport efficiency and a good quantum yield suitable for a photoelectric conversion device can be obtained.

Furthermore, in this embodiment, due to a concentration gradient formed in a thickness direction, the hole-transporting surfactant 5 is replaced with the electron-transporting surfactant 6 at a higher concentration in the area close to the electron transport layer 24 while the hole-transporting surfactant 5 remains at a higher concentration in the area close to the hole transport layer 22, thus making it possible to ensure barrier properties against carriers, and therefore it is also possible to omit the hole transport layer 22 and the electron transport layer 24.

Figure 8:
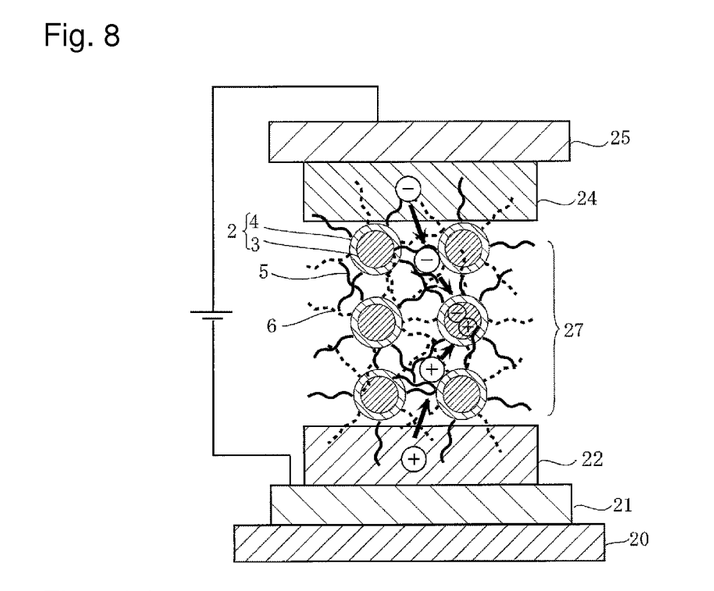
FIG. 8 is a sectional view schematically showing another embodiment of the photoelectric conversion device according to the present invention.

FIG. 8 is a schematic diagram showing another embodiment of the photoelectric conversion device, and the embodiment in this drawing shows the case of a light emitting diode.

That is, the light emitting diode has a structure similar to that of the solar cell described above, wherein a quantum dot layer 27 of laminated structure is interposed between the hole transport layer 22 and the electron transport layer 24.

In the light emitting diode, carriers are injected into the anode 21 and the cathode 25 when a voltage is applied. Among the injected carriers, a hole is injected into the ultrafine grain 2 through the hole-transporting surfactant 5 forming a bulk hetero network. On the other hand, an electron is also injected into the quantum dot 2 through the electron-transporting surfactant 5 forming a bulk hetero network and in the quantum dot 2, the hole and the electron recombine to emit light.

Moreover, the carrier is moved using tunneling resonance to inject the carrier into the quantum dot 2, and therefore carriers can be quickly moved without occurrence of phonon bottleneck.

Further, the carrier can be transported deep in a thickness direction, and therefore high intensity light emission can be performed even though the surface density of the quantum dot 2 is not increased.

Figure 9A:
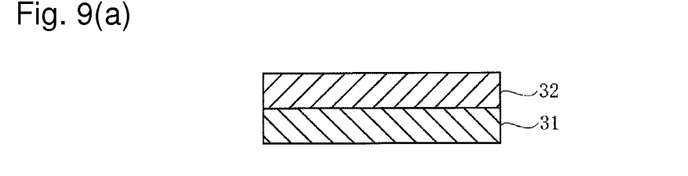
FIGS. 9(a) and 9(b) are production flow charts showing a second embodiment of the method of producing a nanograin material according to the present invention.
Figure 9B:
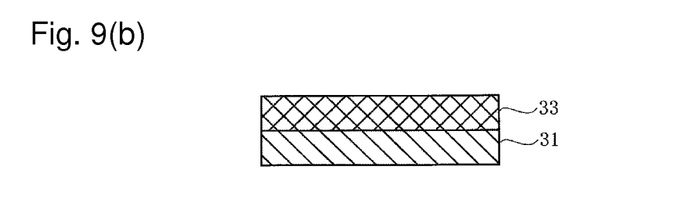

FIGS. 9(a) and 9(b) are a production flow chart showing a second embodiment of the method of producing a nanograin material according to the present invention.

That is, as in the first embodiment described above, an ultrafine grain dispersion solution of InP/ZnS, or the like is prepared, and as shown in FIG. 9(a), the ultrafine grain dispersion solution is applied to a substrate 31 to form a quantum dot layer with an electron-transporting surfactant (quantum dot layer with an electron-transporting characteristic) 32 having one or more layer(s).

A dispersion solution containing the hole-transporting surfactant 5, i.e. a replacement solution is then prepared.

Here, for a dispersion solvent for the replacement solution, a solvent having a polarity opposite to the dispersion solvent for the electron-transporting surfactant 6, for example, a polar solvent such as methanol is used if a nonpolar solvent such as toluene is used for the dispersion solvent for the electron-transporting surfactant 6.

Next, the substrate 31 having the quantum dot layer with an electron-transporting characteristic 32 formed on the surface is immersed in the aforementioned replacement solution and part of the electron-transporting surfactant 6 is replaced with the hole-transporting surfactant 5 to form a quantum dot layer 33 as shown in FIG. 9(b), and this quantum dot layer 33 is the nanograin material 1.

That is, in the first embodiment, the quantum dot layer with a hole-transporting characteristic 8 is formed on the substrate 7 and thereafter immersed in the replacement solution containing the electron-transporting surfactant to prepare the nanograin material (see FIGS. 2(a) and 2(b)), but as in the second embodiment, the quantum dot layer with an electron-transporting characteristic 32 may be formed on the substrate 31, followed by immersing the quantum dot layer with an electron-transporting characteristic 32 in the replacement solution containing the hole-transporting surfactant to thereby prepare the nanograin material.

In this connection, the present invention is not limited to the embodiment described above.

Furthermore, in the embodiment described above, the quantum dot 2 has a core-shell structure having the core portion 3 and the monolayer shell portion 4, but the invention may also be applied similarly to a core-shell-shell structure in which the shell portion 4 has a bilayer structure and a quantum dot having no shell portion.

Furthermore, for a photoelectric conversion device which performs conversion of a light signal to an electric signal, the invention may be applied similarly to an optical sensor and a imaging device such as CCD in addition to a solar cell. Further, for a photoelectric conversion device which performs conversion of an electric signal to a light signal, the invention may be applied similarly to a semiconductor laser and various kinds of displays in addition to a light emitting diode.

Furthermore, in the embodiment described above, the electron transport layer 24 is prepared by a dry process using a vacuum deposition process, but may be prepared by a wet process such as a spin coating process. In this case, however, it is required to use a solution containing a solvent having a polarity identical to that of a dispersion solution used in an immersion step.

Furthermore, in the embodiment described above, a polar solvent is used for the dispersion solvent for the hole transport layer material, a nonpolar solvent is used for the dispersion solvent for the hole-transporting surfactant, and a polar solvent is used for the dispersion solvent for the replacement solution, but it is only required to use solvents having opposite polarities so that they do not mix with one another in a next step, and it is also possible to use a nonpolar solvent for the dispersion solvent for the hole transport layer material, use a polar solvent for the dispersion solvent for the hole-transporting material and use a nonpolar solvent for the dispersion solvent for the replacement solution, and a hole transport layer material, a hole-transporting surfactant, an electron-transporting surfactant and an electron transport layer material which are suitable for these solvents can be selected as appropriate.

Furthermore, in the embodiment described above, a compound semiconductor made of InP/ZnS is used as an ultrafine grain film, but oxides and element semiconductors may be similarly applied as a matter of course.

Thus, a nanograin material useful for various kinds of photoelectric conversion devices such as solar cells, which has excellent carrier transport characteristics without recombination of carriers in a surfactant, can be produced.

DESCRIPTION OF SYMBOLS 2 quantum dot (ultrafine grain)
5 hole-transporting surfactant
6 electron-transporting surfactant
8 quantum dot layer (ultrafine grain film) with a hole-transporting characteristic
21 anode (first electrode)
22 hole transport layer
23 quantum dot layer
24 electron transport layer
25 cathode (second electrode)
27 quantum dot layer
32 quantum dot layer (ultrafine grain film) with an electron-transporting characteristic

The invention claimed is:

1. A method of producing a nanograin material, the method comprising:
   forming a film containing ultrafine grains having a grain size of 10 nm or less using a first dispersion solution having a first polarity, the ultrafine grains being covered with a first surfactant having a first transporting characteristic; and
   immersing the film in a second dispersion solution having a second polarity opposite the first polarity, the second dispersion solution containing a second surfactant having a second transporting characteristic different from the first transporting characteristic so that the ultrafine grains of the film are covered with both the first and second surfactants, and, through the film, the film has a changing ratio of the first surfactant to the second surfactant between opposed first and second surfaces of the film, and a first concentration of the first surfactant at the first surface is greater than that of the second surfactant at the first surface and a second concentration of the second surfactant at the second surface is greater than that of the first surfactant at the second surface,
   wherein the first transporting characteristic is one of a hole-transporting characteristic and an electron-transporting characteristic.

2. The method of producing a nanograin material according to claim 1, wherein the first transporting characteristic is the hole-transporting characteristic and the second transporting characteristic is the electron-transporting characteristic.

3. The method of producing a nanograin material according to claim 1, wherein the first transporting characteristic is the electron-transporting characteristic and the second transporting characteristic is the hole-transporting characteristic.

4. The method of producing a nanograin material according to claim 1, wherein, when immersing the film in the dispersion solution containing the second surfactant, part of the first surfactant is replaced with the second surfactant so that the first surfactant having the first transporting characteristic and the second surfactant having the second transporting characteristic are concurrently present.

5. The method of producing a nanograin material according to claim 1, wherein the film contains an oxide, a compound semiconductor and an element semiconductor.

6. The method of producing a nanograin material according to claim 1, wherein one of the first surfactant and the second surfactant includes a material having a ligand introduced into a hole transport material layer.

7. The method of producing a nanograin material according to claim 6, wherein the hole transport material layer is selected from the group consisting of N,N'-diphenyl-N,N'-bis(3-methylphenyl)-1,1'-biphenyl-4,4'-diamine, 4,4'-bis[N-(1-naphthyl)-N-phenyl-amino]biphenyl, 4,4',4''-tris(2-naphthylphenylamine)triphenylamine, N,N'-7-di(1-naphthyl)-N,N'-diphenyl-4,4'-diaminobiphenyl), and 4,4',4''-tris(3-methylphenylphenylamino)triphenylamine.

8. The method of producing a nanograin material according to claim 1, wherein one of the first surfactant and the second surfactant includes a material having a ligand introduced into an electron transport layer material.

9. The method of producing a nanograin material according to claim 8, the an electron transport layer material is selected from the group consisting of 2-(4-biphenylyl)-5-(4-t-butylphenyl)-1,3,4-oxadiazole, 2,2',2''-(1,3,5-benzylnitrile)-tris(1-phenyl-1-H-benzoimidazole, 2,9-dimethyl-4,7-diphenyl-1,10-phenanthroline, 3-(benzothiazole-2-yl)-7-(diethylamino)-2H-1-benzopyran-2-one, bis(2-methyl-8-quinolinolate)-4-(phenylphenolate aluminum, and 4,4'-bis(9-carbazolyl)-2,2'-dimethylbiphenyl.

10. A nanograin material prepared by the method according to claim 1.

11. The nanograin material according to claim 10, wherein the first surfactant has a HOMO level which tunneling-resonates with a valence band of a quantum dot.

12. The nanograin material according to claim 11, wherein the second surfactant has a LUMO level which tunneling-resonates with a transfer band of the quantum dot.

13. The nanograin material according to claim 10, wherein the first surfactant has a LUMO level which tunneling-resonates with a transfer band of a quantum dot.

14. The nanograin material according to claim 13, wherein the second surfactant has a HOMO level which tunneling-resonates with a valence band of the quantum dot.

15. A photoelectric conversion device having a quantum dot layer interposed between a first electrode and a second electrode, wherein the quantum dot layer comprises the nanograin material according to claim 10.

16. The photoelectric conversion device according to claim 15, wherein an electron transport layer is located between one of (1) the first electrode and the quantum dot layer and (2) the second electrode and the quantum dot layer.

17. The photoelectric conversion device according to claim 16, wherein the electron transport layer is located between the first electrode and the quantum dot layer, and a hole transport layer is located between the second electrode and the quantum dot layer.

18. The photoelectric conversion device according to claim 16, wherein the electron transport layer is located between the second electrode and the quantum dot layer, and a hole transport layer is located between the first electrode and the quantum dot layer.

19. The method of producing a nanograin material according to claim 1, wherein the first surfactant has a HOMO level which tunneling-resonates with a valence band of a quantum dot.

20. The method of producing a nanograin material according to claim 19, wherein the second surfactant has a LUMO level which tunneling-resonates with a transfer band of the quantum dot.

* * * * *